United States Patent
Price et al.

(10) Patent No.: US 10,234,593 B2
(45) Date of Patent: Mar. 19, 2019

(54) FORMATION FLUID ANALYSIS TOOL COMPRISING AN INTEGRATED COMPUTATIONAL ELEMENT AND AN OPTICAL FILTER

(71) Applicant: Halliburton Energy Services, Inc., Houston, TX (US)

(72) Inventors: James M. Price, The Woodlands, TX (US); Aditya B. Nayak, Houston, TX (US); Bin Dai, Spring, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 15/122,885

(22) PCT Filed: Sep. 3, 2015

(86) PCT No.: PCT/US2015/048375
§ 371 (c)(1),
(2) Date: Aug. 31, 2016

(87) PCT Pub. No.: WO2017/039675
PCT Pub. Date: Mar. 9, 2017

(65) Prior Publication Data
US 2017/0269259 A1    Sep. 21, 2017

(51) Int. Cl.
*G01V 8/02* (2006.01)
*E21B 49/08* (2006.01)
(Continued)

(52) U.S. Cl.
CPC ............... *G01V 8/02* (2013.01); *C23C 14/24* (2013.01); *C23C 14/35* (2013.01);
(Continued)

(58) Field of Classification Search
CPC .................................................... G01V 8/02
(Continued)

(56) References Cited

U.S. PATENT DOCUMENTS 7,123,416 B1    10/2006    Erdogan et al.
2003/0072869 A1    4/2003    Decusatis et al.
(Continued)

FOREIGN PATENT DOCUMENTS

EP    2943774 A1    11/2015
WO    2014084834 A1    6/2014
(Continued)

OTHER PUBLICATIONS

International Search Report and Written Opinion issued in related PCT Application No. PCT/US2015/048375 dated Dec. 1, 2015, 12 pages.
(Continued)

*Primary Examiner* — Tarifur Chowdhury
*Assistant Examiner* — Omar Nixon
(74) *Attorney, Agent, or Firm* — Benjamin Fite; Baker Botts L.L.P.

(57) ABSTRACT

An example formation fluid analysis tool includes an optical element and a detector configured to receive light passed through the optical element. The optical element is configured to receive light from a fluid sample and comprises a substrate, an integrated computational element (ICE) fabricated on a first side of the substrate, and an optical filter fabricated on a second side of the substrate opposite the first side.

24 Claims, 4 Drawing Sheets

(51) Int. Cl.
  *C23C 14/24* (2006.01)
  *C23C 14/35* (2006.01)
  *C23C 16/455* (2006.01)
  *G02B 5/20* (2006.01)

(52) U.S. Cl.
  CPC ........ *C23C 16/45525* (2013.01); *E21B 49/08* (2013.01); *G02B 5/20* (2013.01); *E21B 2049/085* (2013.01)

(58) Field of Classification Search
  USPC .......................................................... 356/70
  See application file for complete search history.

(56) References Cited

U.S. PATENT DOCUMENTS

| 2011/0085233 | A1* | 4/2011 | Furusato | G02B 1/115 |
| | | | | 359/359 |
| 2013/0284898 | A1* | 10/2013 | Freese | G01N 21/17 |
| | | | | 250/208.2 |
| 2013/0287061 | A1 | 10/2013 | Freese et al. | |
| 2014/0166871 | A1* | 6/2014 | Jamison | E21B 49/08 |
| | | | | 250/254 |

FOREIGN PATENT DOCUMENTS

| WO | 2014123544 A1 | 8/2014 |
| WO | 2015-005905 A1 | 1/2015 |
| WO | 2015-084351 A1 | 6/2015 |
| WO | 2015142351 A1 | 9/2015 |

OTHER PUBLICATIONS

European Search Report in related EP application No. EP15903247, dated Dec. 12, 2018 (6 pages).

\* cited by examiner

FORMATION FLUID ANALYSIS TOOL COMPRISING AN INTEGRATED COMPUTATIONAL ELEMENT AND AN OPTICAL FILTER

CROSS-REFERENCE TO RELATED APPLICATION

The present application is a U.S. National Stage Application of International Application No. PCT/US2015/048375 filed Sep. 3, 2015, which is incorporated herein by reference in its entirety for all purposes.

BACKGROUND

This disclosure generally relates to tools for characterizing fluids present in hydrocarbon wellbores. In particular, this disclosure relates to a formation fluid analysis tool that includes an integrated computational element (ICE) and a band pass filter fabricated on the same substrate.

When performing subterranean operations in wellbores, it is often desirable to obtain information about the subterranean formation, including information regarding the fluids present in the formation. During sampling and testing the formation, for instance, formation fluid may be passed by a formation fluid analysis tool that includes an integrated computational element (ICE) (e.g., a tool incorporated on a wireline formation tester). An optical source may be configured to direct its light at the formation fluid such that the light is the directed toward the formation fluid analysis tool, which may be designed to measure responses from the formation fluid as a function of the wavelength of the optical source (e.g., as a function of optical wavelength). The data collected by the formation fluid analysis tool may be analyzed for estimation of fluid properties such as fluid composition, density, or viscosity.

BRIEF DESCRIPTION OF THE DRAWINGS

These drawings illustrate certain aspects of certain embodiments of the present disclosure. They should not be used to limit or define the disclosure.

While embodiments of this disclosure have been depicted and described and are defined by reference to example embodiments of the disclosure, such references do not imply a limitation on the disclosure, and no such limitation is to be inferred. The subject matter disclosed is capable of considerable modification, alteration, and equivalents in form and function, as will occur to those skilled in the pertinent art and having the benefit of this disclosure. The depicted and described embodiments of this disclosure are examples only, and not exhaustive of the scope of the disclosure.

DETAILED DESCRIPTION

Formation fluid analysis tools may be used in downhole drilling systems to determine one or more characteristics of formation fluids (e.g., fluid composition, density, or viscosity). This may be performed using spectral information associated with the formation fluids collected by the formation fluid analysis tools. During analysis, the data collected by the formation fluid analysis tool may be restricted to a particular range of wavelengths in order to increase its accuracy and/or sensitivity. This may be done by filtering out unwanted spectral contributions from the optical source using optical filters such as band pass filters introduced into the path between the formation fluid and a integrated computational element (ICE) of the formation fluid analysis tool (i.e., light reflected from the formation fluid first passes through an optical filter before being passed through the ICE of the formation fluid analysis tool). Typically, the ICE is a separate component from any optical filter that may be used. The introduction of these additional components may cause issues during use due to the complexity of keeping multiple components aligned optically in downhole environments. Some current systems may attempt to couple ICEs with optical filters using adhesives to avoid such issues. However, doing so requires additional handling time during manufacturing, which may potentially introduce error into the manufacturing process and cause decreased manufacturing yields due to operator error.

Accordingly, the present disclosure describes an optical element of a formation fluid analysis tool that comprises an ICE and a band pass filter fabricated on the same substrate. For example, an optical element of a formation fluid analysis tool according to the present disclosure may include an ICE fabricated on a first side of a substrate, and an optical filter fabricated on a second, opposite side of the substrate. Fabricating both components onto the same substrate may allow for increased accuracy and/or sensitivity of the optical element. In addition, the optical element may have increased reliability as opposed to separated ICEs and filters. Furthermore, fabrication on the same substrate may allow for the use of multiple different filters coupled to multiple ICEs on a single formation fluid analysis tool, which may allow for much more precise data collection. This may allow for each ICE-filter pair on a formation fluid analysis tool to be specifically focused on a particular fluid characteristic and/or analyte of interest in the formation.

To facilitate a better understanding of the present disclosure, the following examples of certain embodiments are given. In no way should the examples be read to limit, or define, the scope of the disclosure. Embodiments of the present disclosure may be applicable to horizontal, vertical, deviated, multilateral, u-tube connection, intersection, bypass (drill around a mid-depth stuck fish and back into the wellbore below), or otherwise nonlinear wellbores in any type of subterranean formation. Certain embodiments may be applicable, for example, to logging data acquired with wireline, slickline, and logging while drilling/measurement while drilling (LWD/MWD). Certain embodiments may be applicable to subsea and/or deep sea wellbores. Embodiments described below with respect to one implementation are not intended to be limiting. Embodiments of the present disclosure and its advantages are best understood by referring to FIGS. 1 through 5, where like numbers are used to indicate like and corresponding parts.

Figure 1:
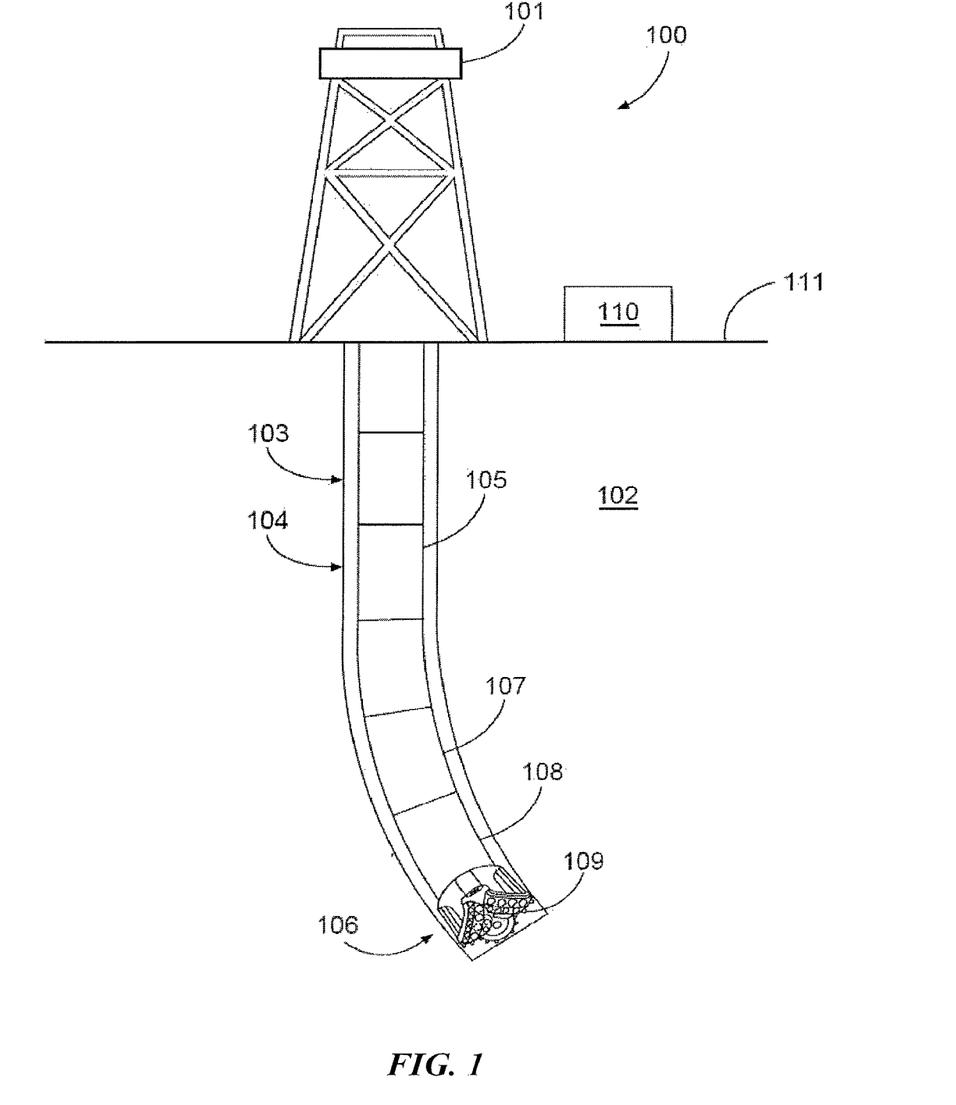
FIG. 1 illustrates an example downhole drilling system, in accordance with embodiments of the present disclosure.

FIG. 1 illustrates an example downhole drilling system 100, in accordance with embodiments of the present disclosure. The drilling system 100 includes a rig 101 located at a surface 111 and positioned above a wellbore 103 within a subterranean formation 102. In certain embodiments, a drilling assembly 104 may be coupled to the rig 101 using a drill string 105. In other embodiments, the drilling assembly 104 may be coupled to the rig 101 using a wireline or a slickline, for example. The drilling assembly 104 may include a bottom hole assembly (BHA) 106. The BHA 106 may include a drill bit 109, a steering assembly 108, and a LWD/MWD apparatus 107. A control unit 110 located at the surface 111 may include a processor and memory device, and may communicate with elements of the BHA 106 (e.g., formation fluid analysis tools in the LWD/MWD apparatus 107). The control unit 110 may receive data from and send control signals to the BHA 106 or components thereof. Additionally, in some embodiments, at least one processor and memory device may be located downhole within the BHA 106 for the same purposes. The LWD/MWD apparatus 107 may log the formation 102 (i.e., sample, test, and/or otherwise obtain information about the formation) both while the wellbore 103 is being drilled, and after the wellbore is drilled to provide information regarding ongoing subterranean operations.

Modifications, additions, or omissions may be made to FIG. 1 without departing from the scope of the present disclosure. For example, formation fluid analysis tools in accordance with the present disclosure may be located in steering assembly 108 and/or drill bit 109 in addition to, or instead of, in LWD/MWD apparatus 107 as described above. As another example, components may be added to downhole drilling system 100 or removed from downhole drilling system 100 without departing from the scope of the present disclosure.

Figure 2:
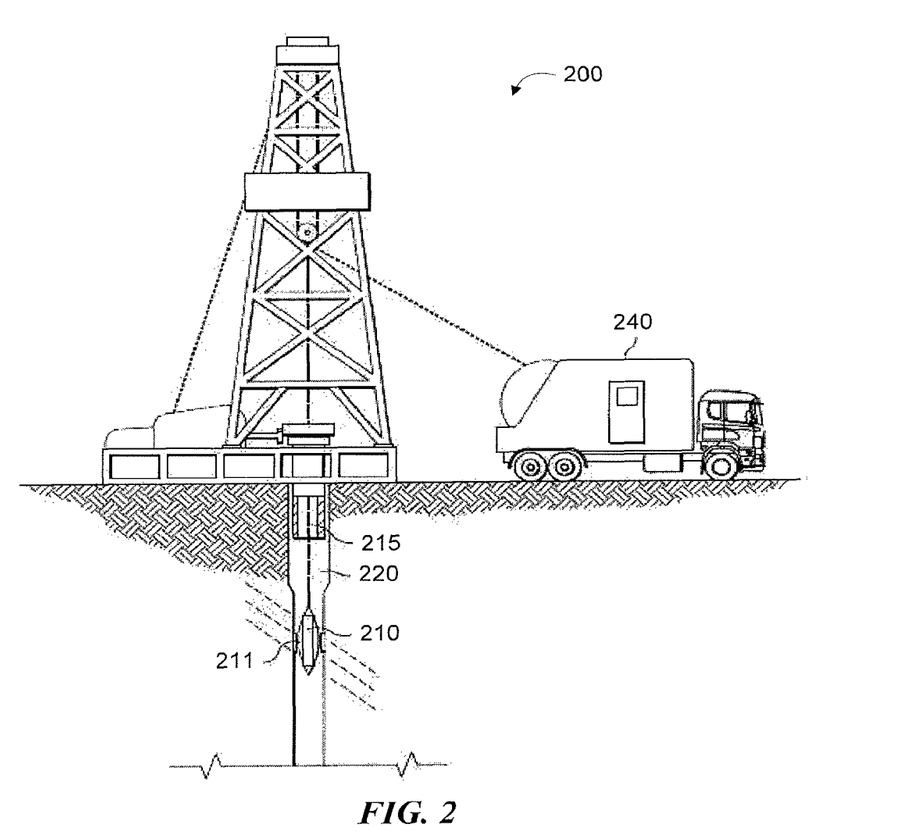
FIG. 2 illustrates an example downhole system with the drill string removed, in accordance with embodiments of the present disclosure.

FIG. 2 illustrates an example downhole logging system 200 with the drill string removed, in accordance with embodiments of the present disclosure. At various times after the drilling is completed, drill string 105 of FIG. 1 may be removed from wellbore 103 and a formation fluid analysis tool may be used to log information (i.e., sample, test, and/or otherwise obtain information) about fluids in the subterranean formation. Subterranean operations such as logging may be conducted using wireline system 210 once the drill string has been completely removed. Wireline system 210 may include one or more logging tools 211 attached to a tool string that may be suspended into wellbore 220 by conveyance 215 (e.g., a cable, slickline, coiled tubing, or the like). Logging tool 211 may comprise one or more formation fluid analysis tools installed thereon, in particular embodiments. Logging tool 211 may be communicatively coupled to conveyance 215. Conveyance 215 may contain conductors for transporting power to wireline system 210 and telemetry from logging tool 211 to logging facility 240. Alternatively, conveyance 215 may lack a conductor, as is often the case using slickline or coiled tubing, and wireline system 210 may contain a control unit similar to control unit 110, shown in FIG. 1, that contains memory, one or more batteries, and/or one or more processors for performing operations and storing measurements. Logging facility 240 (shown in FIG. 2 as a truck, although it may be any other structure) may collect measurements from logging tool 211, and may include computing facilities for controlling, processing, or storing the measurements gathered by logging tool 211. The computing facilities may be communicatively coupled to logging tool 211 by way of conveyance 215 and may operate similarly to control unit 110 as shown in FIG. 1.

Modifications, additions, or omissions may be made to FIG. 2 without departing from the scope of the present disclosure. For example, components may be added to downhole logging system 200 or removed from downhole logging system 200 without departing from the scope of the present disclosure.

Figure 3:
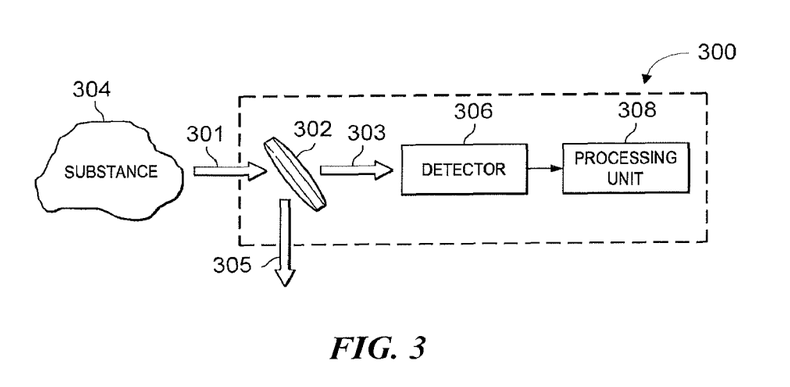
FIG. 3 illustrates a block diagram of a formation fluid analysis tool configured to determine one or more characteristics of a sample, in accordance with embodiments of the present disclosure.

FIG. 3 illustrates a block diagram of an formation fluid analysis tool 300 configured to determine one or more characteristics of a sample 304 in accordance with some embodiments of the present disclosure. As used herein, the term "characteristic" may refer to a chemical, mechanical or physical property of a substance or material. A characteristic of a substance may include a quantitative value or a concentration of one or more chemical components therein. Example characteristics of a substance that can be monitored with the formation fluid analysis tools disclosed herein can include, for example, formation fluid content (e.g., oil, gas, and/or brines), pH, viscosity, or any other suitable fluid characteristic, or combinations thereof. Formation fluid analysis tool 300 may be used in one or more components of downhole drilling system 100 and/or downhole logging system 200 as described above. Accordingly, formation fluids analysis tool 300 may be used to collect and analyze one or more characteristics of formation fluids in a drilling environment.

Formation fluid analysis tool 300 may include an optical element 302 configured to receive light 301 transmitted through, reflected from, or radiated from a sample 304. Optical element 302 may be configured to detect a characteristic of sample 304 based on the received light 301. When light interacts with sample 304, unique physical and/or chemical information about sample 304 may be encoded in light 301 that is transmitted through, reflected from, or radiated from sample 304. Information associated with each different characteristic may be encoded in light 301. Light 301 may come from any number of sources. For example, light 301 may originate from heat emanating from sample 304. As another, example, light 301 may be radiation emanating from or fluorescing from sample 304. In other embodiments, light 301 may be derived from an active source (e.g., infrared, UV, or visible light) that illuminates sample 304. The source may be located within a portion of a drilling system (e.g., drilling system 100) or a downhole logging system (e.g., downhole logging system 200).

Sample 304 may be any type of downhole formation fluid that may have one or more characteristics that may be of interest. For example, in the context of drilling, sample 304 may include one or more liquids or gases in the wellbore. Accordingly, light 301 received from sample 304 may include information associated with any number of characteristics associated with sample 304. For example, light 301 may include information indicating formation fluid content (e.g., oil, gas, and/or brines), pH, viscosity, or any other suitable fluid characteristic, or combinations thereof.

Optical element 302 may be configured to receive light 301 and detect a particular characteristic of sample 304 based on a correlation associated with the particular characteristic included in light 301. For example, optical element 302 may include one or more integrated computational elements (ICEs) and one or more filters, in particular embodiments.

There are a wide variety of implementations that may be employed to create optical element 302. In particular embodiments, optical element 302 may include one or more ICEs. ICEs of optical element 302 may comprise a plurality of alternating layers of optical elements (e.g., silicon, germanium, or other similar materials) with transmissive, reflective, and/or absorptive properties suitable for detecting a characteristic of interest. For example, the alternating layers may be Niobium Pentoxide ($Nb_2O_5$) and Niobium deposited on a substrate (e.g., glass, diamond, quartz, sapphire, ZnSe, ZnS, Ge, or Si). In general, the materials forming the alternate layers may consist of materials that have indices of refraction that differ from one another, e.g., one has a low index of refraction and the next has a high index of refraction. Other suitable materials for the layers may include but are not limited to, metals and their oxides and semiconductor materials and their oxides, nitrides, and carbides such as germanium and Germania, MgF2, SiO, SiC. The number of layers and the thickness of the layers may be determined and constructed from the spectral attributes of the characteristic of interest as determined from a spectroscopic analysis of the characteristic using a conventional spectroscopic instrument. In general, the combination of layers may correspond or may be related to the spectral correlation of the characteristic of interest.

The multiple layers may have different refractive indices. By properly selecting the materials of the layers and their spacing, an ICE of optical element 302 can be made to selectively transmit, absorb, and/or reflect predetermined fractions of light at different wavelengths. Each wavelength may be given a pre-determined weighting or loading factor. The thicknesses and spacing of the layers may be determined using a variety of approximation methods from the spectrograph of the characteristic of interest. These methods may include solving Fresnel equations or performing inverse Fourier transforms (IFT) of the optical transmission spectrum and structuring the optical calculation device as the physical representation of the IFT. The approximations convert the IFT into a structure based on known materials with constant refractive indices. In addition to solids, in some embodiments, an ICE of optical element 302 may also contain liquids and/or gases in combination with solids to create the desired layers. An ICE of optical element 302 may also include holographic optical elements, gratings, and/or acousto-optic elements, for example, that may create the transmission, reflection, and/or absorption properties of interest for the layers of optical element 302.

The weightings that ICE of optical element 302 layers apply at each wavelength are set such that they relate or correlate to the regression weightings described with respect to a known equation, or data, or spectral correlation of the characteristic of interest. The intensity of transmitted, absorbed, or reflected light 303 is related to the amount (e.g., concentration) of the characteristic of interest associated with sample 304. Accordingly, an ICE of optical element 302 may be configured to detect a particular characteristic of sample 304 based on the correlation associated with the particular characteristic that is included in received light 301.

The operation of an ICE is often illustrated in the optical transmission mode. However, it will be understood that an ICE of optical element 302 can operate as well in other optical modes, such as reflection, absorption, transflectance, Raman, Brillion, and Raleigh scattering modes, emittance or fluorescent modes, as well as evanescent modes.

Components of an ICE of optical element 302 may also be realized with a variety of other techniques. These include, but are not limited to holographic optical elements (HOE's), phase gratings, optical gratings, Digital Light Pipe (DLP) devices, liquid crystal devices, photo-acoustic devices, and even naturally occurring substances such as water (e.g. in a curvette or holder) and gases (e.g. water vapor, CO, $CO_2$, methane, hydrocarbon gases, NO and NOx nitrogen gases).

In addition to an ICE, optical element 302 may include one or more optical filters configured to transmit only a portion of the spectral range of light 301. In particular embodiments, the one or more optical filters of optical element 302 may comprise a plurality of alternating layers of optical elements (e.g., silicon, germanium, or other similar materials) with transmissive, reflective, and/or absorptive properties suitable for detecting a characteristic of interest. For example, the alternating layers may be Silicon and Quartz ($SiO_2$) deposited on a substrate (e.g., glass, diamond, quartz, sapphire, ZnSe, ZnS, Ge, or Si). In certain embodiments, the alternating layers that make up the optical filter of optical element 302 may be deposited on the same substrate as the ICE of optical element 302. That is, the one or more optical filters of optical element 302 may be fabricated upon the same substrate that the one or more ICEs of optical element are fabricated upon.

Formation fluid analysis tool 300 may also include a detector 306 configured to receive transmitted light 303 from optical element 302. Detector 306 may include any suitable apparatus, system, or device configured to detect the intensity of transmitted light 303 and generate a signal related to the intensity of transmitted light 303 received from optical element 302. For example, detector 306 may be configured to generate a voltage related to the intensity of transmitted light 303. Detector 306 may communicate the signal (e.g., a voltage signal) related to the intensity of transmitted light 303 to a processing unit 308. Examples of detectors include split detectors, quad detectors, and array detectors.

Processing unit 308 may be configured to receive the signal communicated from detector 306 and correlate the received signal with the characteristic of which optical element 302 is configured to detect. For example, optical element 302 may be configured to detect temperature of sample 304, wherein the intensity of transmitted light 303 from optical element 302 may be related to the temperature of sample 304. Accordingly, detector 306 may generate a voltage signal based on the intensity of light 303 and may communicate the voltage signal to processing unit 308. Processing unit 308 may then correlate the received voltage signal with a temperature such that processing unit 308 may determine a temperature of sample 304.

Processing unit 308 may include a processor that is any system, device, or apparatus configured to interpret and/or execute program instructions and/or process data associated with formation fluid analysis tool 300. The processor may be, without limitation a microprocessor, microcontroller, digital signal processor (DSP), application specific integrated circuit (ASIC), or any other digital or analog circuitry configured to interpret and/or execute program instructions and/or process data. In some embodiments, the processor may interpret and/or execute program instructions and/or process data stored in one or more computer-readable media included in processing unit 308.

The computer-readable media may be communicatively coupled to the processor and may include any system, device, or apparatus configured to retain program instructions and/or data for a period of time (e.g., computer-readable media). The computer-readable media may include random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to processing unit 308 is turned off. In accordance with some embodiments of the present disclosure, the computer-readable media may include instructions for determining one or more characteristics of sample 304 based on signals received from detector 306.

Optical element 302 may also be configured to reflect portions of light 301 not related to the characteristic of interest as reflected electromagnetic radiation 305. In some embodiments, optical element 302 may reflect light 305 toward another detector (not expressly shown in FIG. 3). The detector configured to receive reflected light 305 may be configured to generate a signal associated with reflected light 305 and communicate the signal to processing unit 308. Processing unit 308 may use the signal associated with light 305 to normalize the signal associated with transmitted light 303. In alternative embodiments, optical element 302 may be configured such that reflected light 305 may be related to the characteristic of interest and transmitted light 303 may be related to other characteristics of sample 304.

Formation fluid analysis tool 300 may be configured to detect and determine a characteristic of sample 304 based on light 301 received from sample 304. Formation fluid analysis tool 300 may include any number of optical elements 302 and associated detectors 306 configured to detect any number of characteristics of sample 304. Processing unit 308 may accordingly be configured to determine one or more properties of sample 304 based on the different characteristics detected by different optical elements 302 and associated detectors 306. Example characteristics that may be determined include formation fluid content (e.g., oil, gas, and/or brines), pH, viscosity, density, salt content, opacity, combinations thereof, and the like. In many cases, the characteristics described above directly correlate to the signal of the formation fluid analysis tool and no further analysis is required to obtain the characteristic of interest. In some embodiments, processing unit 308 may be configured to store collected data associated with a detected characteristic in any suitable storage medium. The collected data may then be retrieved at a later time and may be analyzed and processed to determine various properties of sample 304. In embodiments where formation fluid analysis tool 300 is integrated with a drilling tool, processing unit 308 may be configured to communicate information associated with a detected characteristic to a well site using any suitable logging/measurement while drilling (LWD/MWD) communication system.

When monitoring more than one characteristic at a time, various configurations of optical elements 302 may be used. For example, formation fluid analysis tool may include multiple optical elements 302, where each optical element 302 has been configured to detect a particular characteristic and/or analyte of interest. In such embodiments, each optical element 302 may comprise a unique ICE/optical filter combination configured to the detect the particular characteristic and/or analyte of interest.

Modifications, additions, or omissions may be made to FIG. 3 without departing from the scope of the present disclosure. For example, although illustrated as having one optical element 302, formation fluid analysis tool 300 may comprise any number of optical elements 302, each of which comprises any number of ICEs and/or optical filters. As another example, formation fluid analysis tool 300 may comprise any suitable number of detectors 306, including detectors for detecting light reflected by optical elements 302 (e.g., light 305 in FIG. 3).

Figure 4:
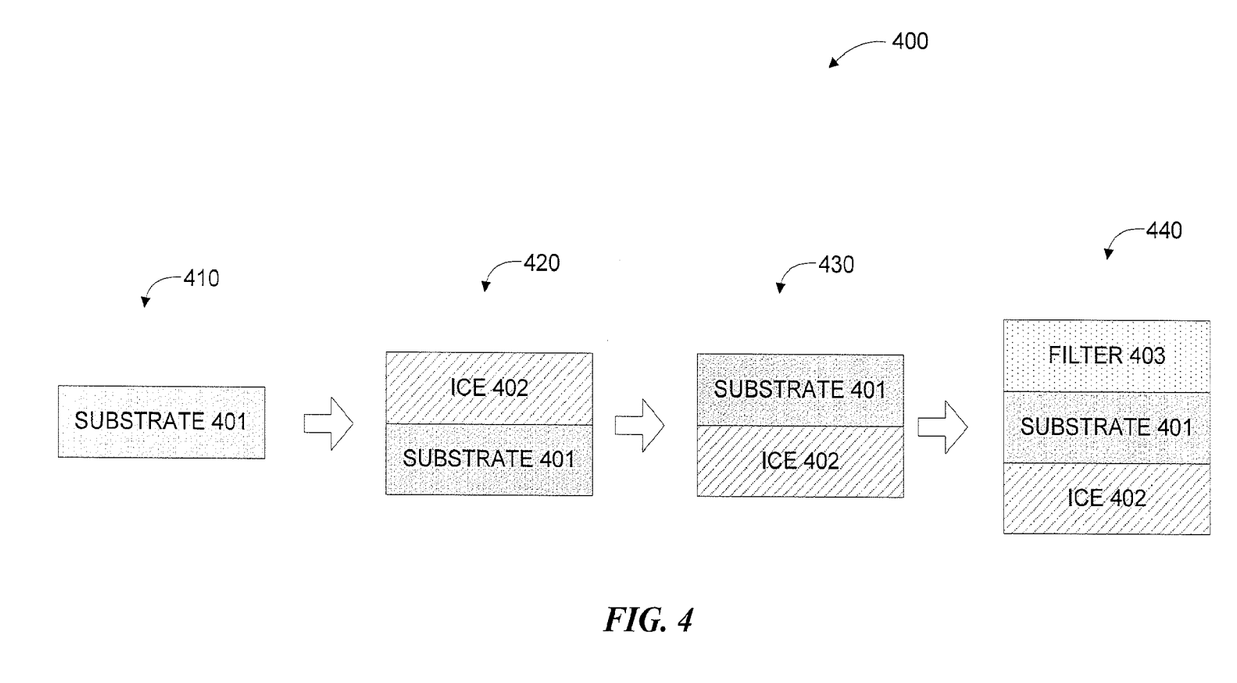
FIG. 4 illustrates an example method for fabricating an optical element of a formation fluid analysis tool that comprises an ICE and an optical filter fabricated on a substrate, in accordance with embodiments of the present disclosure.

FIG. 4 illustrates an example method 400 for fabricating an optical element of a formation fluid analysis tool that comprises an ICE 402 and an optical filter 403 fabricated on a substrate 401, in accordance with embodiments of the present disclosure. The method 400 begins at step 410 with a substrate 401. Substrate 401 may be composed of any suitable material for use in fabricating ICEs and/or optical filters thereon. As an example, substrate 401 may be composed of a borosilicate glass (e.g., SCHOTT BK7). Other examples of substrate materials may include silicon or germanium. In particular embodiments, the material chosen for substrate 401 may depends on a wavelength range of interest (e.g., the wavelength range of the optical filter and/or the ICE transmittance spectra region).

At step 420, an ICE 402 is fabricated onto a first side of substrate 401. ICE 402 may be fabricated onto substrate 401 using any suitable method. For example, ICE 402 may be fabricated onto substrate 401 using a vacuum deposition system (e.g., an ion-assisted E-beam deposition tool) that deposits alternating layers of high- and low-refractive index materials (e.g., silicon, silicon oxide, titanium oxide, or aluminum oxide). Other example fabrication methods for ICE 402 may include magnetron sputtering, atomic layer deposition, and/or chemical vapor deposition. The number and thickness of the various layers may determine one or more characteristics of ICE 402, in particular embodiments, such as the spectral pattern that is transmitted through ICE 402. In certain embodiments, the number and/or thickness of the alternating layers may be determined by solving Fresnel equations.

At step 430, the substrate 401 is turned over, allowing for filter 403 to be fabricated upon the opposite side of the substrate 401 from ICE 402 at step 440. Filter 403 may include any suitable optical filter for use in conjunction with ICE 402. For example, filter 403 may be a band pass filter (narrow or broad), a long pass filter, a short pass filter, or any combination thereof. Filter 403 may be fabricated using any suitable method. For example, filter 403 may be fabricated onto substrate 401 using the same fabrication process as ICE 402 (i.e., using a vacuum deposition system (e.g., an ion-assisted E-beam deposition tool) that deposits alternating layers of high- and low-refractive index materials, such as silicon and silicon oxide). Other example fabrication methods for filter 403 may include magnetron sputtering, atomic layer deposition, and/or chemical vapor deposition.

Modifications, additions, or omissions may be made to method 400 without departing from the scope of the present disclosure. For example, filter 403 may be fabricated onto ICE 402, rather than on an opposite side of substrate 401. As another example, filter 403 may be fabricated using a long pass filter fabricated on a short pass filter. As yet another example, substrate 401 may include any number of substrates and/or constituent components. As another example, the order of the steps may be performed in a different manner than that described (e.g., with filter 403 being fabricated onto substrate 401 prior to ICE 402 being fabricated onto the opposite side of substrate 401), and some steps may be performed at the same time. Additionally, each individual step may include additional steps without departing from the scope of the present disclosure.

Figure 5:
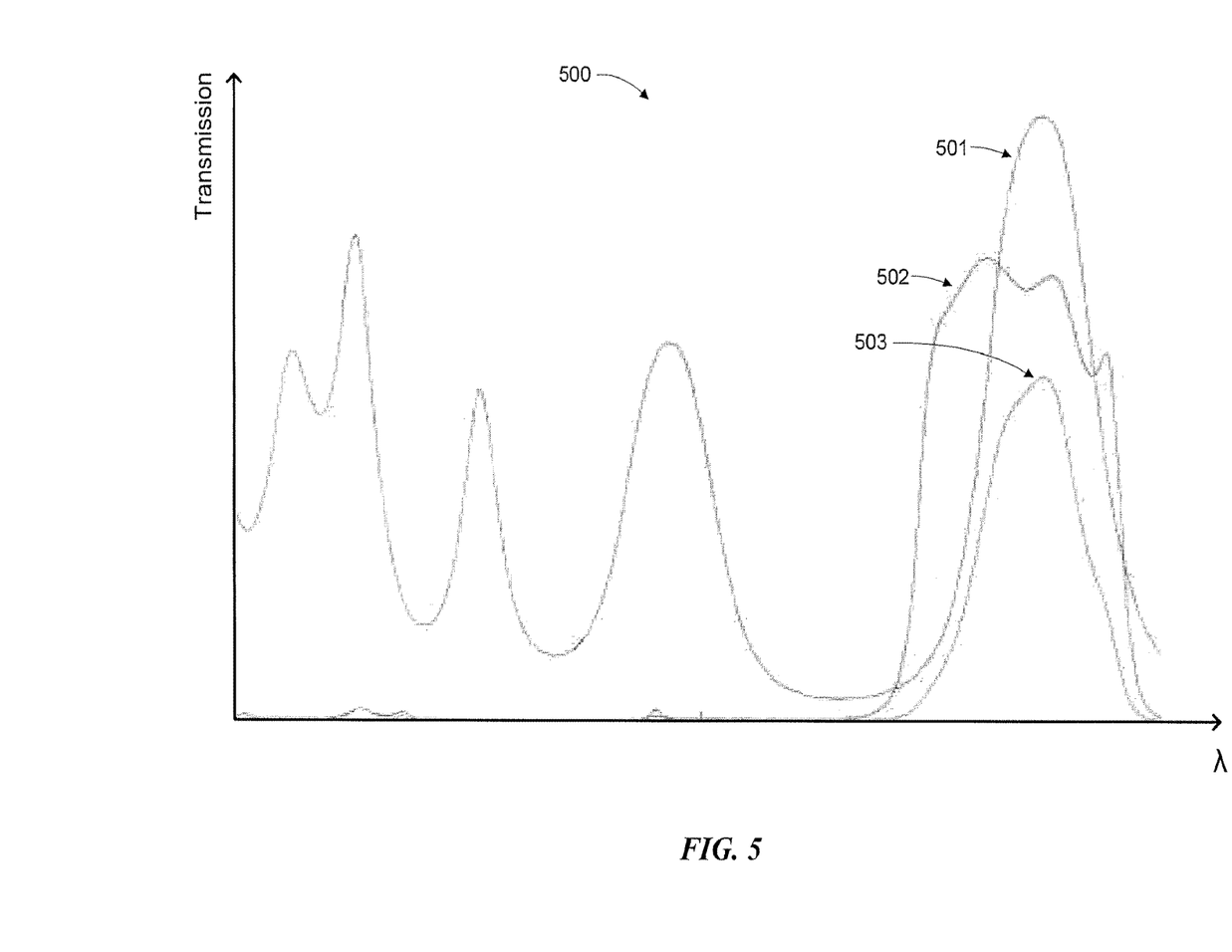
FIG. 5 illustrates an example graph of spectral transmission information for an ICE, a filter, and an optical element comprising an ICE and a filter fabricated on the same substrate, in accordance with embodiments of the present disclosure.

FIG. 5 illustrates an example graph 500 of spectral transmission information 501-503 for an ICE, a band pass filter, and an optical element comprising an ICE and a band pass filter fabricated on the same substrate, respectively, in accordance with embodiments of the present disclosure. In particular embodiments, only a portion of spectral information 501 from ICE may be desired. In current systems, a band pass filter having the spectral transmission according to line 502 may be inserted into the optical path of the ICE in order to limit the spectral information 501 that is passed on. However, for the reasons discussed above, adding additional separate components to the optical path may present a number of issues with respect to the reliability of the formation fluid analysis tool. Accordingly, an optical element comprising an ICE and a band pass filter may be fabricated upon the same substrate such that its spectral transmission information is similar to the spectral transmission information 503, which will be recognized as closely resembling the combination of spectral transmission information 501 and spectral transmission information 502.

To provide illustrations of one or more embodiments of the present disclosure, the following examples are provided.

In one embodiment, a formation fluid analysis tool comprises an optical element configured to receive light from a fluid sample and a detector configured to receive light passed through the optical element. The optical element comprises a substrate, an integrated computational element (ICE) fabricated on a first side of the substrate, and an optical filter fabricated on a second side of the substrate opposite the first side.

In one or more aspects of the disclosed formation fluid analysis tool, the ICE was fabricated using at least one of vacuum deposition, magnetron sputtering, atomic layer deposition, or chemical vapor deposition.

In one or more aspects of the disclosed formation fluid analysis tool, the optical filter was fabricated using at least one of vacuum deposition, magnetron sputtering, atomic layer deposition, or chemical vapor deposition.

In one or more aspects of the disclosed formation fluid analysis tool, the ICE is composed of alternating layers of high- and low-refractive index materials.

In one or more aspects of the disclosed formation fluid analysis tool, the optical filter is composed of alternating layers of high- and low-refractive index materials.

In one or more aspects of the disclosed formation fluid analysis tool, the ICE is composed of Niobium Pentoxide and Niobium.

In one or more aspects of the disclosed formation fluid analysis tool, the optical filter is composed of Silicon and quartz.

In one or more aspects of the disclosed formation fluid analysis tool, the optical filter comprises at least one of: a band pass filter, a short pass filter, and a long pass filter.

In one or more aspects of the disclosed formation fluid analysis tool, the substrate is composed of at least one of: glass, silicon, and germanium.

In another embodiment, an optical element comprises a substrate, an integrated computational element (ICE) fabricated upon a first side of the substrate, and an optical filter fabricated upon a second side of the substrate opposite the first side.

In one or more aspects of the disclosed optical element, the ICE was fabricated using at least one of vacuum deposition, magnetron sputtering, atomic layer deposition, or chemical vapor deposition.

In one or more aspects of the disclosed optical element, the optical filter was fabricated using at least one of vacuum deposition, magnetron sputtering, atomic layer deposition, or chemical vapor deposition.

In one or more aspects of the disclosed optical element, the ICE is composed of alternating layers of high- and low-refractive index materials.

In one or more aspects of the disclosed optical element, the optical filter is composed of alternating layers of high- and low-refractive index materials.

In one or more aspects of the disclosed optical element, the ICE is composed of Niobium Pentoxide and Niobium.

In one or more aspects of the disclosed optical element, the optical filter is composed of Silicon and quartz.

In one or more aspects of the disclosed optical element, the optical filter comprises at least one of: a band pass filter, a short pass filter, and a long pass filter.

In one or more aspects of the disclosed optical element, the substrate is composed of at least one of: glass, silicon, and germanium.

In another embodiment, a method comprises fabricating an ICE upon a first side of a substrate, and fabricating an optical filter upon a second side of the substrate opposite the first side.

In one or more aspects of the disclosed method, the ICE is fabricated upon the first side of the substrate using at least one of vacuum deposition, magnetron sputtering, atomic layer deposition, or chemical vapor deposition.

In one or more aspects of the disclosed method, the optical filter is fabricated upon the second side of the substrate using at least one of vacuum deposition, magnetron sputtering, atomic layer deposition, or chemical vapor deposition.

In one or more aspects of the disclosed method, the ICE is fabricated upon the first side of the substrate by depositing alternating layers of high- and low-refractive index materials.

In one or more aspects of the disclosed method, the optical filter is fabricated upon the second side of the substrate by depositing alternating layers of high- and low-refractive index materials.

In one or more aspects of the disclosed method, the ICE is composed of Niobium Pentoxide and Niobium.

In one or more aspects of the disclosed method, the optical filter is composed of Silicon and quartz.

In one or more aspects of the disclosed method, the optical filter comprises at least one of: a band pass filter, a short pass filter, and a long pass filter.

In one or more aspects of the disclosed method, the substrate is composed of at least one of: glass, silicon, and germanium.

Illustrative embodiments of the present disclosure have been described herein. In the interest of clarity, not all features of an actual implementation may have been described in this specification. It will of course be appreciated that in the development of any such actual embodiment, numerous implementation-specific decisions may be made to achieve the specific implementation goals, which may vary from one implementation to another. Moreover, it will be appreciated that such a development effort might be complex and time-consuming, but would nevertheless be a routine undertaking for those of ordinary skill in the art having the benefit of the present disclosure.

It will be understood that the terms "couple" or "couples" as used herein are intended to mean either an indirect or a direct connection. Thus, if a first device couples to a second device, that connection may be through a direct connection, or through an indirect electrical or mechanical connection via other devices and connections. It will also be understood that the terms "drilling equipment" and "drilling system" are not intended to limit the use of the equipment and processes described with those terms to drilling an oil well. The terms will also be understood to encompass drilling natural gas wells or hydrocarbon wells in general. Further, such wells can be used for production, monitoring, or injection in relation to the recovery of hydrocarbons or other materials from the subsurface. This could also include geothermal wells intended to provide a source of heat energy instead of hydrocarbons.

For purposes of this disclosure, a control unit may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, a control unit may be a personal computer, a network storage device, or any other suitable device and may vary in size, shape, performance, functionality, and price. The control unit may include random access memory ("RAM"), one or more processing resources such as a central processing unit ("CPU") or hardware or software control logic, ROM, and/or other types of nonvolatile memory. Additional components of the control unit may include one or more disk drives, one or more network ports for communication with external devices as well as various input and output ("I/O") devices, such as a keyboard, a mouse, and a video display. The information handling system may also include one or more buses operable to transmit communications between the various hardware components.

The present disclosure is well adapted to attain the ends and advantages mentioned as well as those that are inherent therein. The particular embodiments disclosed above are illustrative only, as the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered or modified and all such variations are considered within the scope and spirit of the present disclosure. Also, the terms in the claims have their plain, ordinary meaning unless otherwise explicitly and clearly defined by the patentee.

What is claimed is:

1. A formation fluid analysis tool, comprising:
   an optical element configured to receive light from a fluid sample, the optical element comprising:
   a substrate;
   an integrated computational element (ICE) fabricated on a first side of the substrate; and
   an optical filter fabricated on a second side of the substrate opposite the first side, wherein the optical filter transmits only a portion of a spectral range of light, and wherein fabricating the ICE and the optical filter on the substrate increases at least one of accuracy and sensitivity of the optical element; and
   a detector configured to receive light passed through the optical element.

2. The formation fluid analysis tool of claim 1, wherein the ICE was fabricated using at least one of vacuum deposition, magnetron sputtering, atomic layer deposition, or chemical vapor deposition.

3. The formation fluid analysis tool of claim 1, wherein the optical filter was fabricated using at least one of vacuum deposition, magnetron sputtering, atomic layer deposition, or chemical vapor deposition.

4. The formation fluid analysis tool of claim 1, wherein the optical filter is composed of alternating layers of materials with different optical characteristics.

5. The formation fluid analysis tool of claim 1, wherein the ICE is composed of Niobium Pentoxide and Niobium.

6. The formation fluid analysis tool of claim 1, wherein the optical filter is composed of Silicon and quartz.

7. The formation fluid analysis tool of claim 1, wherein the optical filter comprises at least one of: a band pass filter, a short pass filter, and a long pass filter.

8. The formation fluid analysis tool of claim 1, wherein the substrate is composed of at least one of: glass, silicon, and germanium.

9. An optical element, comprising:
   a substrate;
   an integrated computational element (ICE) fabricated upon a first side of the substrate; and
   an optical filter fabricated upon a second side of the substrate opposite the first side, wherein the optical filter transmits only a portion of a spectral range of light, and wherein fabrication of the ICE and the optical filter on the substrate increases at least one of accuracy and sensitivity of the optical element.

10. The optical element of claim 9, wherein the ICE was fabricated using at least one of vacuum deposition, magnetron sputtering, atomic layer deposition, or chemical vapor deposition.

11. The optical element of claim 9, wherein the optical filter was fabricated using at least one of vacuum deposition, magnetron sputtering, atomic layer deposition, or chemical vapor deposition.

12. The optical element of claim 9, wherein the optical filter is composed of alternating layers of materials with different optical characteristics.

13. The optical element of claim 9, wherein the ICE is composed of Niobium Pentoxide and Niobium.

14. The optical element of claim 9, wherein the optical filter is composed of Silicon and quartz.

15. The optical element of claim 9, wherein the optical filter comprises at least one of: a band pass filter, a short pass filter, and a long pass filter.

16. The optical element of claim 9, wherein the substrate is composed of at least one of: glass, silicon, and germanium.

17. A method, comprising:
   fabricating an integrated computational element (ICE) of an optical element of a formation fluid analysis tool upon a first side of a substrate; and
   fabricating an optical filter of the optical element upon a second side of the substrate opposite the first side, wherein the optical filter transmits only a portion of a spectral range of light, and wherein fabrication of the ICE and the optical filter upon the substrate increases as least one of accuracy and sensitivity of the optical element.

18. The method of claim 17, wherein the ICE is fabricated upon the first side of the substrate using at least one of vacuum deposition, magnetron sputtering, atomic layer deposition, or chemical vapor deposition.

19. The method of claim 17, wherein the optical filter is fabricated upon the second side of the substrate using at least one of vacuum deposition, magnetron sputtering, atomic layer deposition, or chemical vapor deposition.

20. The method of claim 17, wherein the optical filter is fabricated upon the second side of the substrate by depositing alternating layers of high- and low-refractive index materials.

21. The method of claim 17, wherein the ICE is composed of Niobium Pentoxide and Niobium.

22. The method of claim 17, wherein the optical filter is composed of Silicon and quartz.

23. The method of claim 17, wherein the optical filter comprises at least one of: a band pass filter, a short pass filter, and a long pass filter.

24. The method of claim 17, wherein the substrate is composed of at least one of: glass, silicon, and germanium.

* * * * *